(12) United States Patent
De Vries et al.

(10) Patent No.: US 7,969,095 B2
(45) Date of Patent: *Jun. 28, 2011

(54) METHOD OF AND ARRANGEMENT FOR REMOVING CONTAMINANTS FROM A SUBSTRATE SURFACE USING AN ATMOSPHERIC PRESSURE GLOW PLASMA

(75) Inventors: Hindrik Willem De Vries, Tilburg (NL); Eugen Aldea, Eindhoven (NL); Jan Bastiaan Bouwstra, Biltoven (NL); Mauritius Cornelius Maria Van De Sanden, Tilburg (NL)

(73) Assignee: Fuji Photo Film B.V., Tilburg (NL)

( * ) Notice: Subject to any disclaimer, the term of this patent is extended or adjusted under 35 U.S.C. 154(b) by 736 days.

This patent is subject to a terminal disclaimer.

(21) Appl. No.: 10/584,075

(22) PCT Filed: Dec. 22, 2004

(86) PCT No.: PCT/NL2004/000897
§ 371 (c)(1),
(2), (4) Date: Jul. 16, 2008

(87) PCT Pub. No.: WO2005/062338
PCT Pub. Date: Jul. 7, 2005

(65) Prior Publication Data
US 2008/0271748 A1    Nov. 6, 2008

(30) Foreign Application Priority Data

Dec. 22, 2003  (EP) .................................. 03079009
Aug. 13, 2004  (EP) .................................. 04077286

(51) Int. Cl.
*H05B 31/26*    (2006.01)

(52) U.S. Cl. ......... 315/111.21; 156/345.44; 156/345.47; 118/723 E; 219/121.48; 134/1.1

(58) Field of Classification Search ............ 315/111.21, 315/111.31, 111.41, 111.51, 111.81, 111.91; 219/121.36, 121.43, 121.48, 121.54, 121.57; 313/231.31, 231.41, 231.51; 156/345.43, 156/345.44, 345.47; 118/723 E; 204/164, 204/298.31, 192.1; 427/569; 134/1.1
See application file for complete search history.

(56) References Cited

U.S. PATENT DOCUMENTS 5,414,324 A    5/1995  Roth et al.
6,046,546 A *  4/2000  Porter et al. ............. 315/111.51
(Continued)

OTHER PUBLICATIONS

International Search Report and Written Opinion mailed Apr. 12, 2005 in corresponding International Application Serial No. PCT/NL2004/000897 filed Dec. 22, 2004.

(Continued)

*Primary Examiner* — Jacob Y Choi
*Assistant Examiner* — Ephrem Alemu
(74) *Attorney, Agent, or Firm* — Davidson Berquist Jackson & Gowdey, LLP

(57) ABSTRACT

The present invention relates to a method of and arrangement for removing contaminants from a surface of a substrate by subjecting said substrate surface to an atmospheric pressure glow plasma. Said plasma is generated in a discharge space comprising a plurality of electrodes, by applying an alternating plasma energizing voltage to said electrodes causing a plasma current and a displacement current. Said plasma is stabilised by controlling said displacement current during plasma generation such that modification of properties of said substrate surface is prevented.

29 Claims, 6 Drawing Sheets

U.S. PATENT DOCUMENTS 6,147,452 A * 11/2000 Kunhardt et al. ............ 313/582
6,299,948 B1 * 10/2001 Gherardi et al. ............ 427/569

OTHER PUBLICATIONS

E. Aldea et al., "Generation of a Stable Atmospheric Glow in a DBD Configuration," International Symposium on Plasma Chemistry Proceedings, Jun. 22, 2003, XP009034055, pp. 1-6.

P. Bletzinger and B. N. Ganguly, "The effect of displacement current on fast-pulsed dielectric barrier discharges," Journal of Physics D: Applied Physics, Institute of Physics Publishing, Ltd., UK, vol. 36, No. 13, Jun. 18, 2003, pp. 1550-1552, XP002310826, ISSN: 0022-3727.

T. Yokohama et al., "The mechanism of the stabilisation of glow plasma at atmospheric pressure," Journal of Physics D: Applied Physics, Institute of Physics Publishing, Ltd., UK, vol. 23, No. 8, 1990, pp. 1125-1128, XP002322399, ISSN: 0022-3727.

* cited by examiner

METHOD OF AND ARRANGEMENT FOR REMOVING CONTAMINANTS FROM A SUBSTRATE SURFACE USING AN ATMOSPHERIC PRESSURE GLOW PLASMA

CROSS-REFERENCE TO RELATED APPLICATIONS

This application is a national stage application of International Application PCT/NL2004/000897 filed Dec. 22, 2004 which designated the U.S. and was published under PCT Article 21(2) in English, and which claims priority to European Application No. 03079009.1 filed Dec. 22, 2003 and European Application No. 04077286.5 filed Aug. 13, 2004. The entire contents of each of those applications are herein incorporated by reference.

FIELD OF THE INVENTION

The present invention relates to a method of removing contaminants from a surface of a substrate by subjecting said substrate surface to an atmospheric pressure glow plasma generated in a discharge space comprising one or more electrodes, wherein said plasma is generated by applying an alternating plasma energizing voltage to said electrodes.

The present invention further relates to an apparatus for removing contaminants from a surface of a substrate, comprising a discharge space, wherein said discharge space comprises a plurality of electrodes, means for generating an atmospheric pressure glow plasma in said discharge space in between said electrodes, wherein means for generating said plasma comprise means for applying an AC plasma energizing voltage to said electrodes.

BACKGROUND OF THE INVENTION

In manufacturing processes, such as manufacturing of (semi)conductor coatings, it is common to use processes such as sputtering or chemical vapour deposition which processes do not only produce the desired coating, but as a side effect also contaminate these coatings or surfaces with undesired substances such as carbon, hydrocarbons, or hydrocarbons comprising hydroxyl groups and the like. Manufacturing processes therefore often comprise a cleaning step for removing contaminants from a surface or coating.

Wet cleaning, using various chemicals that interact with the contaminants present on the surface, are widely used in industry. However, although wet cleaning steps have been extensively developed over the years, they often have the disadvantage that the chemicals used interact with both the contaminants as well as the semiconductor surface to be cleaned. Another disadvantage is that after the wet cleaning step, remnants of the chemicals may be present on the surface which have to be removed again as far as this is possible, rendering the cleaning process less efficient and slow.

Another disadvantage of wet cleaning is that it cannot be applied to every type of surface available. A lot of wet cleaning processes make use of aqueous surfactant solutions, acids, different types of solvents and other chemical, which are often aggressive. Sensitive surfaces, such as for example surfaces based on organic substances or oil based surfaces, are not suitable to be cleaned using a wet cleaning process.

In addition to wet cleaning processes, dry cleaning processes are use in industry such as UV cleaning, cleaning processes based on laser light, etc. Each of the cleaning processes have their own field of application, and comprises its own disadvantages.

In recent years, the use of plasmas as a dry cleaning process has been proposed in certain fields of application. Plasmas are also used for all kinds of surface modification techniques. A specific application of plasmas, for example, is to improve the adhesive properties of some surfaces. A disadvantage of using plasmas for this purpose is that the stability of plasmas is often insufficient leading to uncontrollable phenomena such as streamer formation. Due to these effects, plasma cleaning may locally on a surface lead to effective cleaning, but locally on other parts of the surface it leads either to no cleaning at all or to the surface properties of the surface being modified as well. This limits the field of application of plasma cleaning processes extensively.

SUMMARY OF THE INVENTION

It is an object of the present invention to provide a method and arrangement for effectively and homogeneously removing contaminants from the surface of a substrate, using a plasma.

This and other objects are achieved by the present invention in that there is provided a method of removing contaminants from a surface of a substrate by subjecting said substrate surface to an atmospheric pressure glow plasma generated in a discharge space comprising one or more electrodes, wherein said plasma is generated by applying an alternating plasma energizing voltage to said electrodes causing a plasma current and a displacement current, and wherein said plasma is stabilised by controlling said displacement current during plasma generation such that modification of properties of said substrate surface is prevented.

It has been observed that by controlling the displacement current during the plasma generation, and in particular at during certain stages of plasma generation where streamer formation often occurs, instability in, the plasma can be effectively suppressed such that a stable and controllable plasma with homogeneous properties is established. The atmospheric pressure glow plasma acquired can effectively be used for cleaning surfaces such as semiconductor surfaces, organic surfaces, all kind of sensitive surfaces such as paintings, ceramic surfaces, surfaces used in optic appliances, etc. Atmospheric pressure glow plasmas may be provided under atmospheric conditions in air, and at a low temperature, such that a plasma cleaning process acquired using the present invention has a wide field of application. By the method of the present invention surprisingly all kind of contaminants can be removed from the surface of the substrate, while the substrate remains in it's original shape with the original physical properties.

Using the method of the present invention, it is further observed that effective cleaning is achieved at very short exposure times of the surface to the plasma. Exposure times between 0.1 and 10 seconds are already sufficient for a good result. More preferably exposure times of between 0.1 and 1 second can be used. Note that in particular, using the method of the present invention, cleaning of the surface is performed without modifying the physical properties of the surface.

According to an embodiment of the present invention, the step of controlling the displacement current comprises providing a relative decrease of the displacement current during plasma generation. As will be explained below, plasma instabilities may effectively be suppressed with the above embodiment enabling control of the plasma desired for cleaning a substrate surface. In addition to the above, the step of controlling the displacement current may also comprise providing a relative decrease of the displacement current before or just before the onset of a plasma breakdown or plasma pulse during plasma generation.

As we are dealing with an alternating energizing voltage, the sign of the amplitude thereof and also of the displacement current will change from positive to negative. In the case of the positive half cycle or period of the energizing voltage, a decrease of the displacement current will reduce the probability of filament formation. A displacement current having a negative value will not allow the formation of any filaments. Consequently one can prevent the generation of the filaments by decreasing the displacement current during the plasma generation, in accordance with the present invention. This will have a stabilizing effect on the atmospheric glow plasma such that the properties thereof are homogeneous and can be controlled. It becomes thereby possible to control the plasma properties, such as intensity and current, in such a way that the plasma effectively removes the contaminants from the surface subjected to it, while surface modification (e.g. as a result of the plasma being too intense or having a too large plasma current) is prevented. It will be appreciated that the properties of the surface to be treated and, as far as these are known, the contaminants present on the surface, determine the plasma properties required for effective cleaning of the surface.

On the other hand, in the case of the negative half cycle of the energizing voltage a similar explanation, but with opposite signs as mentioned above, is valid.

It has been observed that a relative decrease of the displacement current effectively exterminates plasma instabilities, such as streamers, that tend to develop. It will be appreciated that the term "relative decrease" means that the sign of the changes can be positive as well as negative, dependent on whether the energizing voltage is in the negative half cycle or in the positive half cycle. In particular, for a positive half cycle the term relative decrease means an actual decrease of the displacement current (having a negative slope) going to zero or even a negative. On the other hand, during the negative half cycle, a relative decrease of the displacement current means a positive slope.

Unless it is mentioned otherwise below, the description of the process and/or measures to stabilize the glow plasma in accordance with the present invention is mainly provided for the positive half cycle of the energizing voltage. An identical description for the negative half cycle of the energizing voltage can be equally provided by changing the sign to the opposite.

Preferably, a sharp relative decrease of the displacement current is provided, i.e. said relative decrease of said displacement current is provided in the order of a microsecond and preferably in fractions of a microsecond, and said relative decrease of said displacement current is at least 100%. It has been observed that a homogeneous glow discharge plasma, at atmospheric pressure, may be achieved this way.

According to another embodiment of the present invention, removing of said contaminants is performed in the presence of a gaseous substance or mixture of gaseous substances in the discharge space. In particular, this gaseous substance or mixture of gaseous substances comprises at least one of a group comprising helium, argon, oxygen, nitrogen, carbon dioxide, ammonia, hydrogen, mixtures of oxygen with argon, mixtures of oxygen with helium or mixtures of oxygen with argon and helium, or other mixtures or combinations of the above-mentioned gaseous substances. Good results have been achieved using mixtures of oxygen with helium, and in particular mixtures of oxygen with argon. By the method of the present invention it is thus even possible now to obtain a stable plasma using gases, which according to the prior art would result in an unstable plasma. Because of this the new cleaning method of the present invention can be realised. In a preferred embodiment the percentage of oxygen in the gas mixture is more than 0.1% even more preferable more than 1% but less than 50%. In a preferred embodiment the percentage of oxygen is below 25%.

The surface to be treated may be any surface mentioned hereinabove, however it is noted that the method of the present invention is in particular applicable to substrate surfaces comprising at least one transparent conductive oxide, such as at least one of a group comprising indium tin oxide, tin oxide, indium oxide, zinc oxide, indium cadmium oxide, cadmium tin oxide, cadmium oxide, gallium oxide and combinations thereof. The invention is however not limited to the above-mentioned transparent conductive oxides, but maybe applied to any transparent conductive oxide as far as the requirements for plasma stabilization and controlling the properties for preventing surface modification are met. This is also valid for sensitive surfaces such as for example oil based surfaces (paintings), organic surfaces, polymeric surfaces, ceramic surfaces, etc.

A particular application may for instance include the cleaning of a surface comprising a transparent conductive oxide coated on a dielectric or metal support or surface.

The displacement current may be controlled using controlling means, as will be explained below. These controlling means may comprise for example, and according to an embodiment of the invention, at least one inductor. As will be appreciated, an inductor generally has the property to counteract a change of flux. If the plasma current suddenly (steeply) increases (e.g. in case of a developing streamer) the inductor will respond with an increasing counteracting displacement current. In other words the inductor will relatively decrease the displacement current, relative to the applied energizing voltage. Note that the above is valid for an unsaturated inductor operated at a current far below the saturation current.

In accordance with embodiments of the present invention, the at least one inductor comprises at least one of a group comprising a matching coil operated substantially in an unsaturated mode, or a choke coil operated in a saturated mode. Examples of these application will be described hereinbelow.

According to another embodiment of the present invention, the controlling means comprise pulse generator means providing voltage pulses superimposed on said energizing voltage.

It will be appreciated that a pulse generator as mentioned above provides another means of controlling the displacement current in the process. In particular, the pulse generator means may be controlled such that during plasma generation the second derivative over time of the absolute value of the energizing voltage has a negative value.

According to another embodiment of the present invention, the plasma comprises a plasma pulse having an absolute pulse maximum and said displacement current is controlled by controlling the energizing voltage such that a relative decrease of the displacement current is provided before the pulse maximum. It has been observed that during plasma generation before the pulse maximum, conditions are such that plasma instabilities may easily develop. This is in particular the case during and just after breakdown of the plasma. Therefore, according to another embodiment of the present invention said relative decrease of the displacement current is synchronized with the onset of the plasma pulse.

In this embodiment of the invention, a matching coil having a relatively large inductance and a relatively large saturation current can effectively be applied for stabilizing the plasma. The properties of the unsaturated coil, as explained above, are such that as a result of Lenz Law (the inductor counteracting its flux changes) can effectively be used for providing the decrease of displacement current at the occurrence of streamer formation. It will be appreciated that a suitable choice of the properties of the inductor, such as the inductance, is dependent on the desired plasma properties for cleaning; which is again dependent on the substrate surface.

According to another embodiment of the present invention the plasma comprises a plasma pulse having an absolute pulse maximum, and the displacement current is controlled by controlling the energizing voltage such that a relative decrease of the displacement current is provided after the pulse maximum. Although instabilities may occur at any time during generation of a plasma, it has been observed that the circumstances at the end of a plasma pulse are beneficial to the occurrence and development of instabilities. At the end of the plasma pulse, the plasma current is relatively low while the voltage applied to the AC-power supply increases due to the fact that the AC-power supply tends to recover from the main plasma pulse. The life cycle of the plasma is approaching cut off in this stage of the plasma and the plasma current will decrease sharply, after which small instabilities and plasma variations may occur. Under the influence of the increasing voltage resulting from the recovering AC-power supply, these small instabilities and plasma variations may easily develop in major plasma instabilities, such as streamer formation and glow to arch transition. On the other hand the relatively low and decreasing plasma current in combination with the increasing voltage, make it difficult to suppress or eliminate the instabilities by controlling the displacement current. A solution to this problem is provided, according to an embodiment of the present invention, as will be described below. Note that the major plasma instabilities that occur in this stage of the plasma will jeopardize the homogeneous treatment of the surface to be cleaned and may result in local surface modification as a result of the locally high plasma current.

According to a preferred embodiment of the invention, the relative decrease of the displacement current is synchronized with plasma instabilities occurring after the pulse maximum.

Note that by using a coil which is just saturated or near its saturation point, the plasma instabilities in this stage of the plasma generation (i.e. after the pulse maximum) can be effectively suppressed. A coil which is operated in this range (where the current through the coil is operated near the saturation current of the coil) behaves in a nonlinear manner. The non-linearity of the coil can effectively be used for providing displacement current decreases under the particular difficult conditions for providing such decreases of the displacement current in this stage of the plasma (as mentioned above, low and decreasing plasma current in combination with an increasing voltage applied).

In another embodiment of the present invention, the energizing voltage is shaped such that the displacement current substantially comprises a triangular wave form, i.e. such that during all plasma generation the displacement current has a negative slope relative to the sign of the energizing voltage. It has been observed that the conditions for plasma instability are far from ideal in case the displacement current has a negative slope. Therefore, plasma instabilities will not easily occur in this case.

According to an embodiment of the present invention, the substrate surface to be treated is moved through the discharge space. It will be appreciated that a larger surface can be treated by moving the substrate surface through the discharge space. In case a surface in the form of a small band or film has to be treated, it may be sufficient to move the surface, e.g. with a constant velocity, through the discharge space. In case a larger surface must be treated, or a surface having a non-standard or non-straightforward form, the surface may be moved through the discharge space in two or more directions, e.g. back and forth, in rows and columns, or following another suitable pattern.

Depending on the surface to be cleaned and the amount of substances to be removed the treatment time is varied. The variation in treatment time is dependent on the speed with which the substrate is moved through the plasma compartment and or to the energy of the plasma. Typical treatment (cleaning) times are below 10 seconds, while also cleaning times below one second are possible.

According to another embodiment of the present invention the alternating voltage is operated at a frequency in the range of 1 kHz to 1 mHz.

According to another embodiment of the present invention at least one of the electrodes is covered by a dielectric material.

This last embodiment is based on the insight that in a dielectric barrier discharge the density of the filamentary discharges can be controlled effectively by the displacement current. In a filamentary discharge, a large quantity of charge is generated and accumulates on the dielectric which covers the or each electrode. This results in a substantial drop of the voltage in the direct area of the discharge space where the filament is generated. A new filament cannot be generated in the neighborhood of this area until the voltage between the electrodes, and thereby the gas voltage, is increased. Thus, the displacement current controls the rate of voltage variation and is proportional with the density of filamentary discharges per unit of time.

According to a second aspect of the present invention, there is provided an apparatus for removing contaminants from a surface of a substrate by subjecting said substrate surface to an atmospheric pressure glow plasma, comprising a discharge space, wherein said discharge space comprises one or more electrodes, means for generating said atmospheric pressure glow plasma in said discharge space using said electrodes, wherein means for generating said plasma comprise means for applying an AC plasma energizing voltage to said electrodes for causing a plasma current and a displacement current, wherein said apparatus further comprises means for controlling said displacement current during plasma generation for stabilising said plasma such that modification of properties of said substrate surface is prevented.

In a preferred embodiment of the invention the apparatus is provided with transportation means, which are capable of transporting the substrate which should be cleaned with uniform speed in various directions through the discharge space. In yet another embodiment the apparatus is provided with a plurality of electrodes which can be oriented in various ways. In one embodiment the plurality of electrodes is placed in series and the substrate is moving horizontally through the multitude of discharge spaces. In case of flexible substrates the multitude of electrodes can be shaped in a circular form saving space. In yet another arrangement the electrodes might be placed side by side in one plane instead of opposite to each other. In this case the plasma is generated above the plane in which the electrodes are embedded.

The above-mentioned and other features and advantages of the invention are illustrated in the following description of the preferred embodiment of the present invention, with reference to the enclosed drawings. The present invention described hereinafter will be likewise applicable to the cleaning of any surface such as semiconductor surfaces, surfaces comprising transparent conductive oxides, ceramic surfaces, oil based surfaces, polymeric surfaces, organic surfaces, etc.

BRIEF DESCRIPTION OF THE DRAWINGS

The above-mentioned and other features and advantages of the invention are illustrated in the following description with reference to the enclosed drawings, wherein.

DETAILED DESCRIPTION OF THE DRAWINGS

Figure 1:
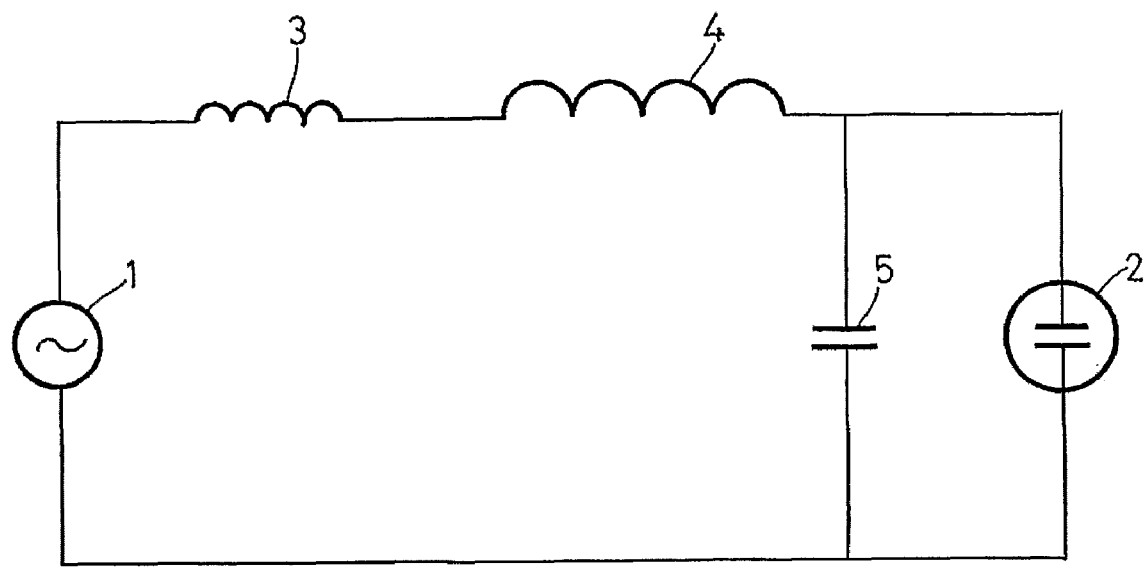
FIG. 1 is a schematic illustration of an arrangement according to an embodiment of the present invention.

FIG. 1 is a schematic illustration of an arrangement according to an embodiment of the present invention, wherein an AC power supply 1 is connected to an electrode configuration 2 forming a discharge space for generating an Atmospheric Pressure Glow (APG) plasma. In series with the electrode configuration 2, there is connected a non-linear electric circuit element in the form of a choke coil 3, which is operated in a saturated state at least during a plasma pulse generated using the AC power supply 1 and in particular in the period of the life cycle of the plasma after its pulse maximum, i.e. at or near the end of the pulse.

In series with the choke coil 3, in accordance with an embodiment of the invention, a further inductor or matching coil 4 is installed which is operated in an unsaturated state. The matching coil 4 is primarily used as phase shifting means, and may be suitably dimensioned for this purpose. In one embodiment, a matching coil having an inductance of 0.7 mH was used together with a ferrite choke coil 3 having an inductance between 0.1 and 0.2 mH. The ferrite used in this choke coil is a 3S4 ferrite (MnZn) with μr=1700, Hc=20 A/m, Br=170 A/m and Bsat=350 A/m.

A capacitance 5 is parallel connected to the electrode configuration 2 for damping of harmonics. This capacitance 5 may be inherently formed by the stray capacitance of the electrode configuration 2, for example.

The effects of the choke coil 3 may be noted best if the saturation current of the choke coil 3 is at least smaller than the displacement current of the circuit of FIG. 1 without a choke coil 3, which is equal to:

$$I_{d, without\_choke} = \omega C V_{max} \quad (1)$$

wherein:
ω=fundamental angular frequency of the AC energizing voltage,
C=capacity of the APG electrode configuration, and
$V_{max}$=amplitude of the AC energizing voltage.
Preferably, the saturation current of the choke coil used is larger than 50% of the displacement current.

The discharge space is arranged for receiving a substrate surface (not shown) to be treated. In particular, in order to clean larger surfaces, the substrate to be cleaned is moved through the discharge space. This may be done at a constant velocity in order to assure that each part of the treated surface has the same residence time in the discharge space. However, dependent on the application, the movement pattern and velocity characteristics may be different. For example, it may be beneficial in order to move the substrate surface back and forth or in different directions, e.g. in rows and columns, or another suitable pattern (for example dependent on the shape of the surface to be cleaned.

In a further embodiment the discharge space of the apparatus is provided with a plurality of electrodes giving a plurality of discharge spaces which can be oriented in various ways. In one embodiment the plurality of electrodes is placed in series and the substrate is moved horizontally through the multitude of discharge spaces. In case of flexible substrates the multitude of electrodes can be shaped in a circular form saving space. In yet another arrangement the electrodes might be placed side by side in one plane instead of opposite to each other (as for example shown in FIG. 5). In this case the plasma is generated above the plane in which the electrodes are embedded and the substrate is moved over said plane.

Figure 2:
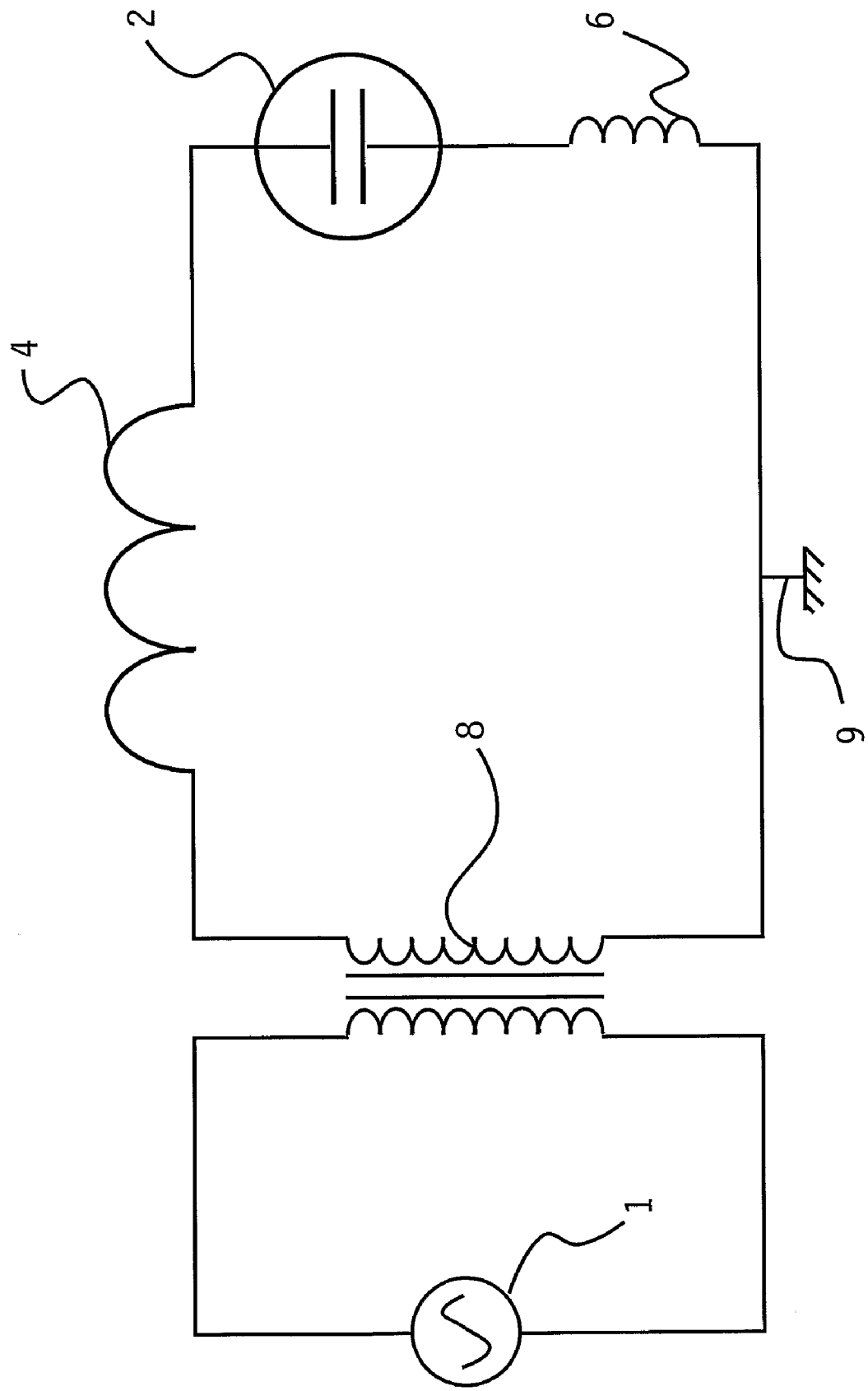
FIG. 2 is an another schematic illustration of an arrangement according to an embodiment of the present invention.

FIG. 2 is an alternative arrangement according to the present invention wherein similar elements as in FIG. 1 are indicated by the same reference numbers. The arrangements of FIG. 2 shows an AC-power supply 1 which is connected, using a isolating transformer 8 to an electrode configuration in the discharge space 2. In series with the electrodes there is provided a matching coil 4 which is operated in an unsaturated state. One of the electrodes of the configuration 2 is grounded (9), and in series with the grounded electrode, choke coil 6 is provided. Choke coil 6 is operated in a saturated or near-saturated state, such that this coil acts as non-linear component.

Figure 3:
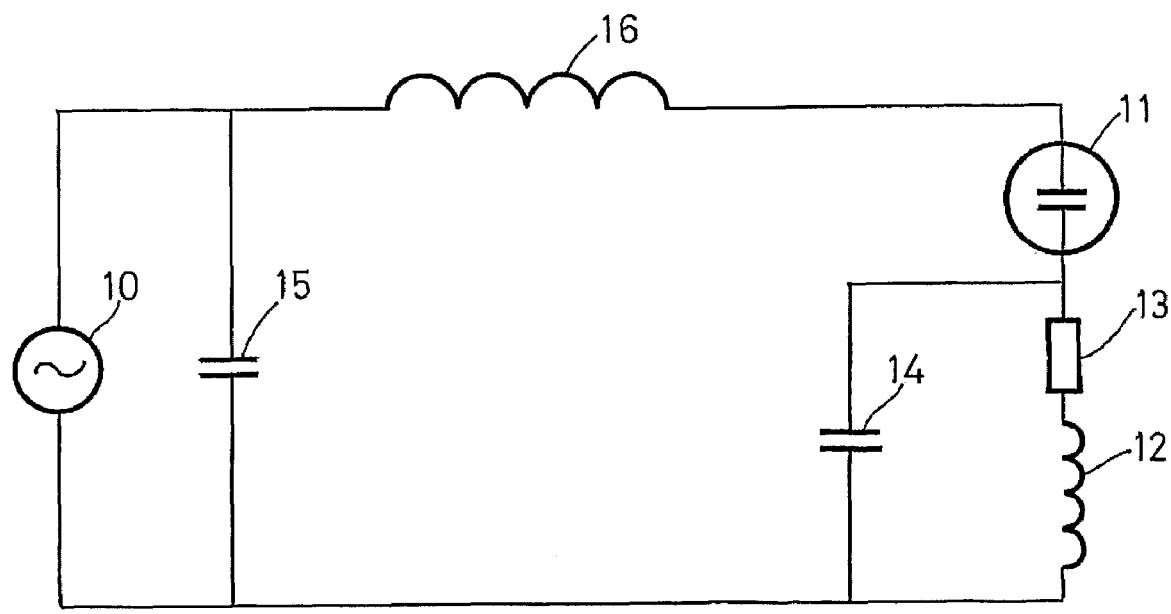
FIG. 3 shows the AC energizing voltage, the plasma current and the displacement current of a plasma generated using an embodiment of the present invention.

FIG. 3 shows another embodiment of the present invention. Here, an AC power supply 10 is connected to an electrode configuration 11. In series with the electrode configuration 11, there is connected a choke coil 12. The capacitor 15 is connected parallel to the electrode configuration 11 and a matching coil 16. A ground wire capacitor 14 is connected in series with the electrode configuration 11 and parallel to the choke coil 12. This ground wire capacitor 14 is arranged for boosting the voltage applied to the choke coil 12, such that choke coil 12 is saturated more easily without affecting power source matching and operation of the circuit. A resistor 13 is connected in series with the choke coil 12.

In the embodiment of FIG. 2, the effects of saturation of the choke coil 12 on the potential of the bottom electrode (ground side) of the electrode configuration 11 is considerable. Saturation of the LC circuit consisting of the choke coil 12 and the ground wire capacitor 14 will generate large potential variations.

Note that, as in FIGS. 1 and 2, the electrode configuration 11 and the discharge space are arranged for receiving a substrate surface to be treated. This substrate surface may, for instance, be moved across the surface of the grounded electrode of the electrode configuration.

Figure 4:
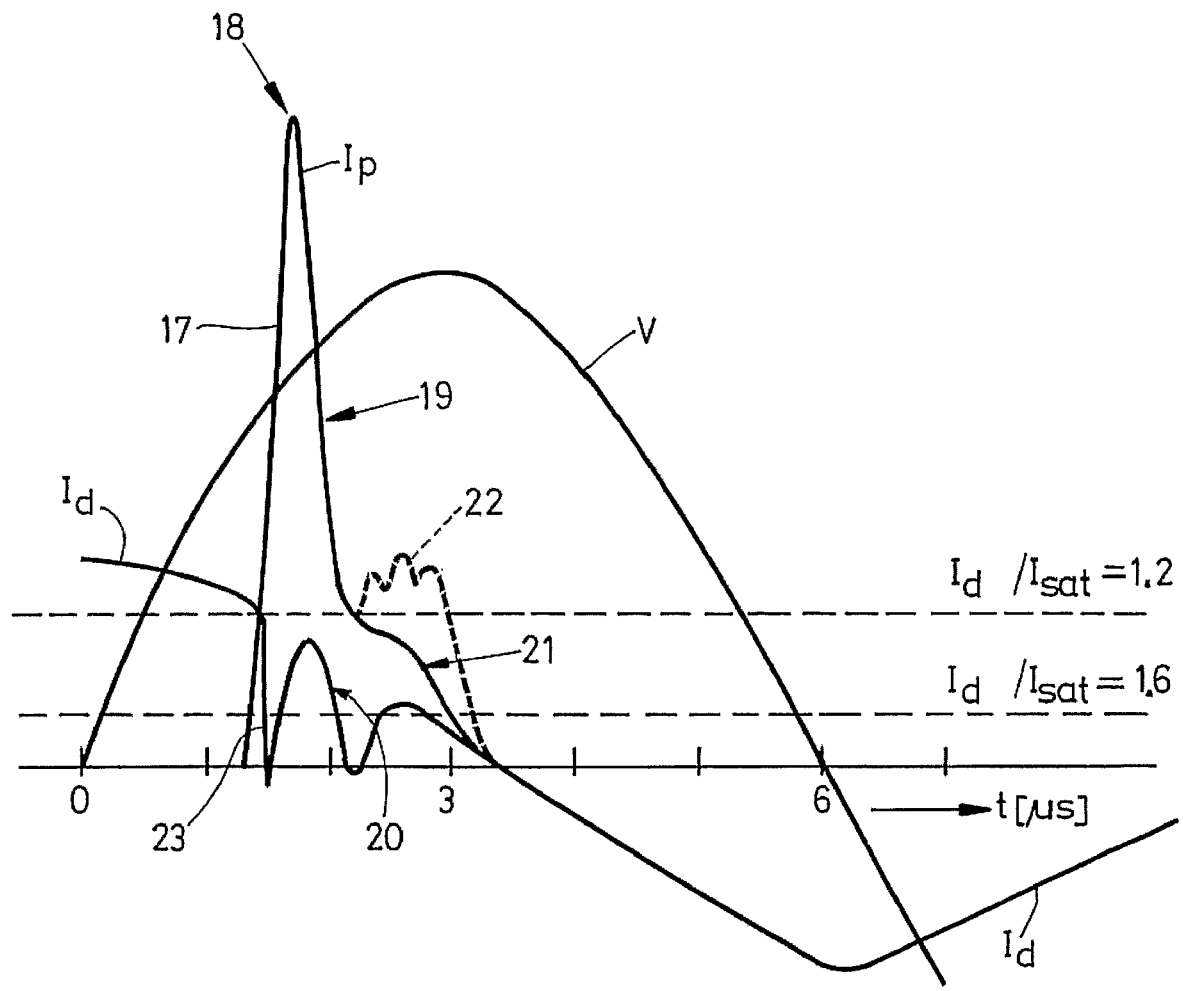
FIG. 4 is another schematic illustration of an arrangement according to an embodiment of the present invention.

FIG. 4 shows a graph of the energizing voltage V, the plasma current $I_p$ and the displacement current $I_d$ over time t, in an embodiment of the method of the present invention with the arrangement shown in FIG. 1. For illustrative purposes, only the positive first halve of the energizing voltage V is shown. A plasma was generated according to the invention under the following conditions: An LC series network at 240 kHz was used with a resonance or matching coil 4 having an inductance of 2 mH, an APG electrode capacitance 5 of 140 pF, a choke coil 3 having an inductance of 0.7 mH, and with $I_d/I_{sat}$=1.4. The pulse time was 100 ms. The gas used was Ar+20% air at atmospheric pressure. To prevent the risk of sparking and for matching reasons a pulsed plasma with a duty cycle of 10% was used.

It can be seen that a plasma pulse 17 is generated having an absolute pulse maximum 18. After the pulse maximum 18, i.e. between time t of approximately 2 and 3 µs, the plasma current $I_p$ decreases, showing a negative slope 19. In accordance with the present invention, in relation to the decrease 19 of the plasma current $I_p$, a relative decrease 20 of the displacement current $I_d$ occurs, caused by the saturated choke 3. As a result, the plasma current $I_p$ shows a relatively clean downward slope 21, without sharp peaks or spikes generated by plasma filaments, providing a stable glow plasma as intended. For illustrative purposes, the broken line 22 illustrates the plasma current $I_p$ in accordance with the prior art, i.e. without the teachings of the invention. One can observe a very irregular current waveform 22, causing unwanted streamers and the like in the plasma.

From FIG. 4 it can be further seen that in the time period at least from just before the plasma breakdown until during the plasma pulse 17 after the pulse maximum 18, the ratio between the displacement current $I_d$ and the saturation current $I_{sat}$ of the choke coil 3 is comprised in a range between 1.2 and 1.6. With this ratio, the displacement current $I_d$ has a substantially triangular shape, except for the regions where the plasma is generated, and shows a relative decrease during the whole of the period from before the start of the plasma pulse 17, after the pulse maximum 18, until the plasma is fully extinguished. This triangular wave form is very beneficial for obtaining a stable plasma. In general, the stability of the plasma is enhanced by steepening the slope of the displacement current, i.e. $dI_d/dt$.

From FIG. 4 it can also be observed that at the generation of the plasma pulse 17, that is before the pulse maximum 18 the displacement current $I_d$ at first drops considerably, i.e. between time t of approximately 1 and 2 µs, indicated by reference numeral 23. This drop 23 of the displacement current $I_d$ is caused by the (unsaturated) matching coil 4. Accordingly, in the arrangement of the invention, as illustratively shown in FIGS. 1, 2 and 3, amongst others, by properly selecting the choke coil such that ratio between the displacement current $I_d$ and the saturation current $I_{sat}$ of the choke coil 3 is comprised in a range between 1.0 and 3, and preferably between 1.2 and 1.6, in combination with an (unsaturated) matching coil, a sharp relative decrease of the displacement current $I_d$ at the generation of the plasma pulse 17 can be obtained, enhancing and sustaining the generation of a stable glow plasma.

It has been observed that by increasing the ratio between the displacement current $I_d$ and the saturation current $I_{sat}$ of the choke coil 3 beyond 1.6, the voltage over the APG electrodes will show a more rectangular shaped waveform.

Best results are achieved with the present invention if the decrease of the displacement current is provided in a short time scale compared to the timescale of the plasma pulse. In general the decrease should be provided preferably in the order of microseconds, or even within a shorter time scale, as shown in FIG. 4.

Those skilled in the art will appreciate that similar waveforms of opposite sign will occur at the negative halve period of the energizing voltage V.

Figure 5:
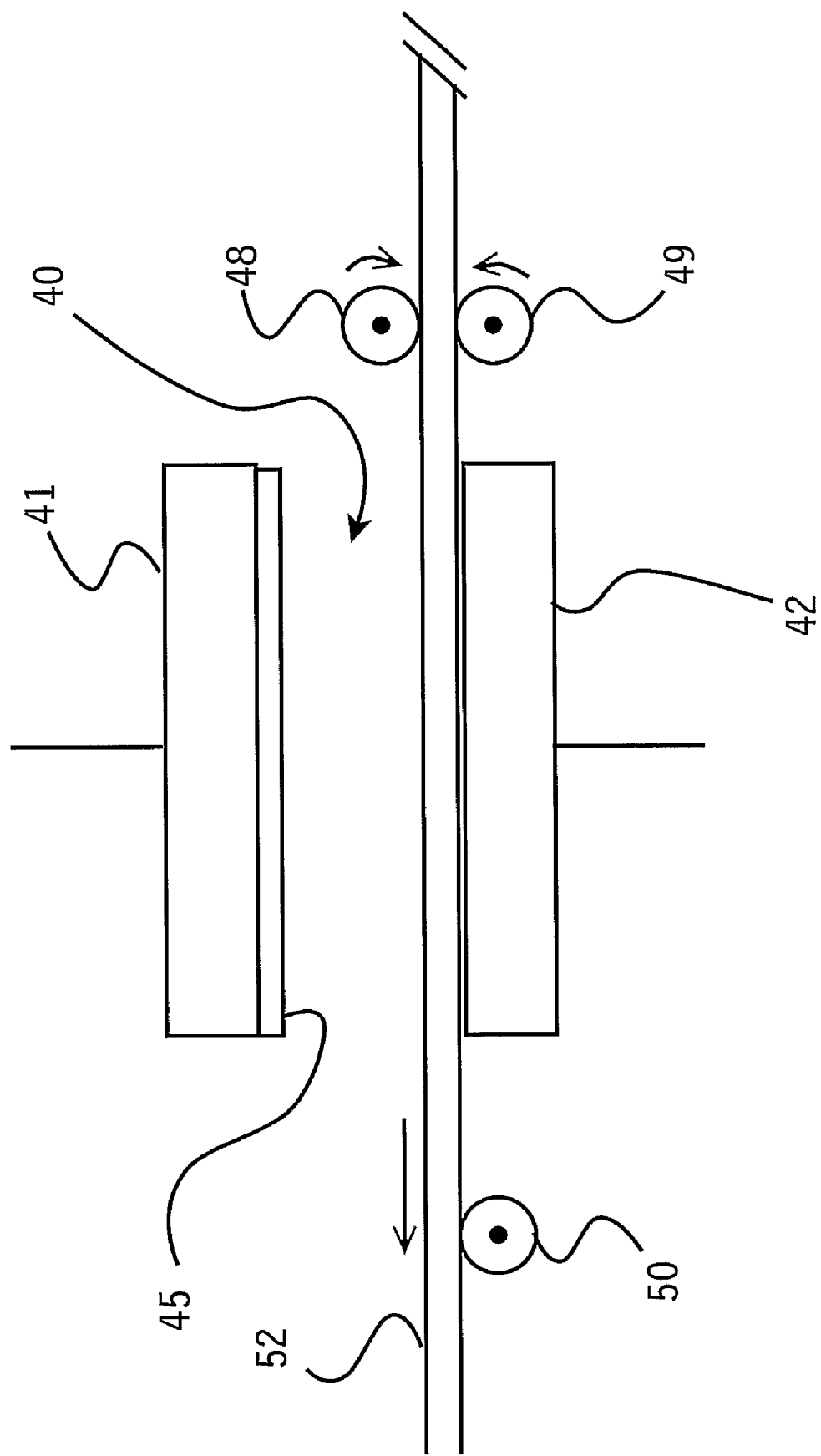
FIG. 5 is an enlargement of an arrangement according to an embodiment of the present invention showing the electrodes and the discharge space including the substrate surface.

FIG. 5 is an enlargement of the discharge space including electrodes, of an arrangement according to an embodiment of the present invention. FIG. 5 discloses discharge space 40 wherein an atmospheric pressure glow plasma is generated in between electrodes 41 and 42. Electrode 42 may be grounded, whilst electrode 41 is connected to the output of a high frequency AC-power supply (such as power supply 1 or 10 in FIGS. 1, 2 and 4). Electrode 41 is covered with a dielectric material 45, which may comprise glass, enamel, aluminum, or another material. Alternatively, or in addition, also electrode 42 may be covered with a dielectric material (not shown) of the same nature as the dielectric material used for covering electrode 41. A substrate surface 52, which may be comprised of indium tin oxide coated on glass for example, is moved through the discharge space using transportation means 48, 49 and 50, comprising wheels 48 and 49 rotating in different directions, and mechanically biassing the substrate 52. Wheels 48 and 49 may, for instance be covered with an elastic material, such as rubber, in order to sufficiently bias substrate surface 52 for transportation thereof through the discharge space, and in order to avoid slippage of the wheels. Wheel 50 only serves to support substrate surface 52 after it has left the discharge space. Wheels 48 and 49 are mechanically driven, e.g. by means of a motor.

Note that the substrate 52 is moved through the discharge space 40 across the surface of grounded electrode 42. The only important requirement for cleaning the surface 52, is that this surface faces the discharge space such that it may be in contact with the plasma generated. Occasionally, the substrate carrying the surface 52 to be treated, may itself be of a material and thickness suitable to use a dielectric instead of, or in addition to, dielectric 45 on one of the electrodes. In this case, it may be possible to clean two surfaces at the same time, one being moved across the surface of electrode 42, and one across the surface of electrode 41.

Note further that the electrodes 41 and 42 in FIG. 5 are positioned opposite to each other. Good results have been achieved using this configuration. However, it will not always be the most suitable arrangement for treating any surface. Suppose a surface to be cleaned is coated on a support which is too large to fit through the discharge space, another suitable arrangement may be achieved using two electrodes positioned transverse to each other, or by using a single electrode and grounding (if possible) the substrate.

In general, good results are achieved under the following conditions:

| | |
|---|---|
| AC energizing voltage frequency: | 1 kHz-1 MHz; |
| Thickness of dielectric on RF electrode: | 0.05-5 mm (preferrably <0.5 mm); |
| Gap distace (discharge space): | 0.1-5 mm; |
| Choke coil $I_{sat}/I_{disp}$: | 1.2-1.6. |

The skilled person will however appreciate that sufficiently good results may be achieved outside the abovementioned ranges, without departing from the inventive concept as described in the appended claims.

An illustrative experiment with the embodiment shown in FIG. 2 was performed using the method of the present invention. In this case, power supply 1 was a AC power supply providing an alternating current energizing voltage comprising a frequency which is adaptable within the range of 50-450 kHz. The forwarded power was 32 Watt, which equals a power density of about 0.4 Watt/cm$^2$. The arrangement comprised a standard LC-series at 350 kHz, comprising a matching coil of 2 mH and a capacitor of 100 pF representing the plasma electrodes. The choke coils 6 and 7 are both 1.3 mH and the ratio between the saturation current and the displacement current is approximately $I_{sat}/I_{disp}=1.4$.

The gap distance between the electrodes in the electrode configuration was 0.4 mm, however in other experiments it has been observed that the gap distance can be increased up to several millimetres. The discharge space was filled using a mixture of argon with approximately 2% oxygen at atmospheric pressure, which was continuously refreshed. For avoiding the risk of sparks and for matching reasons a pulsed signal with a duty cycle of 10% and pulse time of 100 ms was used. Effective processing times or residence times of 0.5, 1 to 50 seconds were used.

The TCO used in the experiments is Indium Tin Oxide (ITO) coated on a 1 mm thick glass substrate. Other TCO's are ZnO, SnO and InO, but here ITO was chosen since it is the most commonly applied TCO. The dielectric on the top electrode was essentially made of glass because the glass is a stable dielectric which will not deteriorate too much in the cleaning process. Furthermore it will not contaminate the ITO surface. Any other dielectric is suitable however. Samples were placed in the APG reactor on the bottom electrode, such that the ITO layer faced the discharge space.

In the table below the results are shown of the quality evaluation of an untreated sample of ITO on glass compared to a surface which was subjected to a plasma as described above. The treatment times were 1 and 5 second. It was observed, that after 1 second already a satisfactory clean surface was obtained.

|  | Reference | Treatment time | |
|---|---|---|---|
|  |  | 1 s | 5 s |
| Quality | X | ○ | ○ |

X = many dark stains
○ = no stains present

Figure 6:
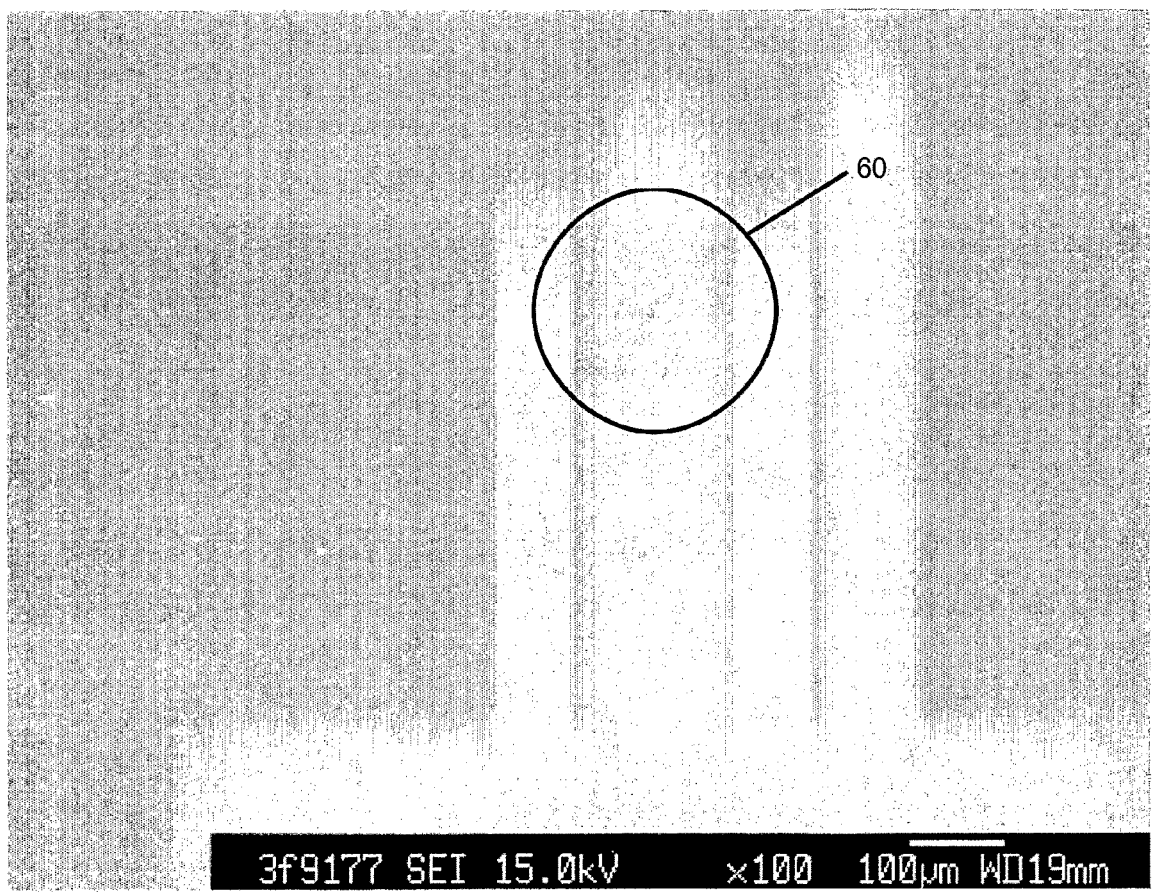
FIG. 6 is a picture taken with a scanning electron microscope (SEM) of a surface cleaned with a method of the present invention.
Figure 7:
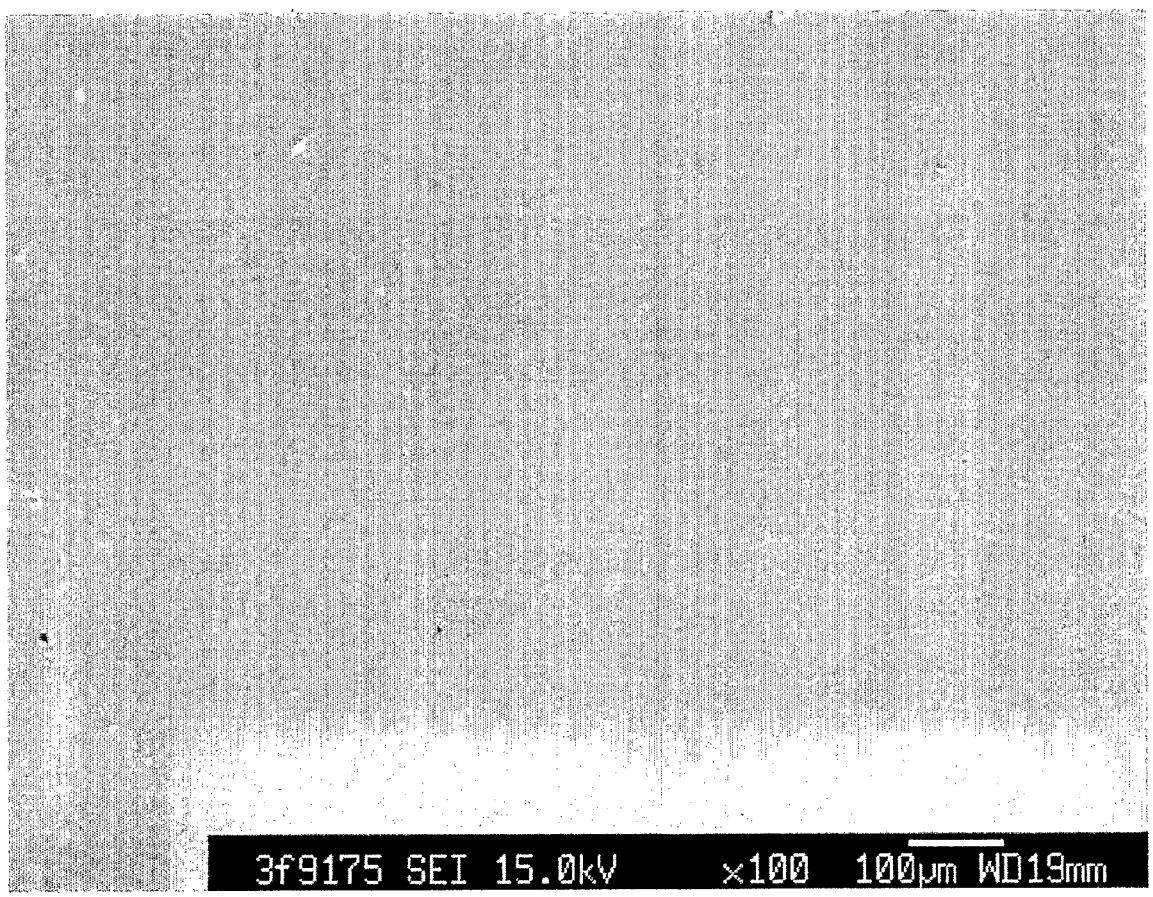
FIG. 7 is a picture taken with a scanning electron microscope (SEM) of the surface of FIG. 6 before cleaning with a method of the present invention.

Scanning electron microscope (SEM) pictures of the surface before cleaning are shown in FIG. 6. Dark spots are visible on the surface in FIG. 6 in the area indicated by circle 60 before cleaning. Similar spots were observed to be not present after cleaning, as can be seen from FIG. 7 presenting the same surface after cleaning for 1 second using a method of the present invention.

The cleaning method of the invention can be used for effectively cleaning an ITO surface without bringing physical damage to the surface. The experiment clearly shows that only very short exposure times are required for effectively cleaning the surface, whilst a homogeneously cleaned surface is achieved using the invention.

A organic light emitting diode (OLED) for testing purposes was made using the APG cleaned surface (2 times 20 second net treatment) and the luminous efficacy (it is the luminance divided by the current density) of this OLED was compared with the efficacy of an OLED prepared using an ITO surface which was cleaned in a conventional way (rinsing with various solvents and ultra violet-ozone (UV-ozone) treatment for 30 minutes). The OLED manufactured with the atmospheric pressure glow (APG) plasma cleaned surface had in average a 30% higher efficacy than the OLED made with the indium-tin-oxide (ITO) surface which was cleaned in the conventional way.

Those skilled in the art will appreciate that many modifications and additions can be made without departing from the novel and inventive scope of the invention as defined in the appending claims.

The invention claimed is:

1. Method of removing contaminants from a surface of a substrate by subjecting said substrate surface to an atmospheric pressure glow plasma generated in a discharge space comprising one or more electrodes, wherein said plasma is generated by applying an alternating plasma energizing voltage to said electrodes causing a plasma current and a displacement current, and wherein said plasma is stabilised by controlling said displacement current during plasma generation such that modification of properties of said substrate surface is prevented.

2. Method according to claim 1, wherein said step of controlling said displacement current comprises providing a relative decrease of said displacement current during plasma generation.

3. Method according to claim 2, wherein said relative decrease of said displacement current is provided in fractions of a microsecond, and wherein said relative decrease of said displacement current is at least 100% in a fraction of a microsecond.

4. Method according to claim 1, wherein removing of said contaminants is performed in the presence of a gaseous substance or mixture of gaseous substances in said discharge space.

5. Method according to claim 4, wherein said gaseous substance or mixture of gaseous substances comprises at least one of a group comprising helium, argon, oxygen, nitrogen, carbon dioxide, ammonia, hydrogen, mixtures of oxygen with argon, mixtures of oxygen with helium, or mixtures of oxygen with argon and helium.

6. Method according to claim 1, wherein said surface of said substrate comprises at least one transparent conductive oxide.

7. Method according to claim 6, wherein said transparent conductive oxide comprises at least one of a group comprising indium tin oxide, tin oxide, indium oxide, zinc oxide, indium cadmium oxide, cadmium tin oxide, cadmium oxide, gallium oxide, and combinations thereof.

8. Method according to claim 6, wherein said at least one transparent conductive oxide is coated on a dielectric or metal surface.

9. Method according to claim 1, wherein said displacement current is controlled using controlling means, and wherein said controlling means comprises at least one inductor.

10. Method according to claim 9, wherein said at least one inductor comprises at least one of a group comprising a matching coil operated substantially in an unsaturated mode, and a choke coil operated in a saturated mode.

11. Method according to claim 1, wherein said displacement current is controlled using controlling means, wherein said controlling means comprises pulse generator means providing voltage pulses superimposed on said energising voltage.

12. Method according to claim 2, wherein said plasma comprises plasma pulse having an absolute pulse maximum, and wherein said displacement current is controlled by controlling said energizing voltage such that said relative decrease of said displacement current is provided before said pulse maximum.

13. Method according to claim 12, further comprising a step of synchronizing said relative decrease of said displacement current with the onset of said plasma pulse.

14. Method according to claim 12, wherein said energizing voltage is controlled such that said relative decrease of said displacement current is provided before the onset of said plasma pulse.

15. Method according to claim 2, wherein said plasma comprises plasma pulse having an absolute pulse maximum, and wherein said displacement current is controlled by controlling said energizing voltage such that said relative decrease of said displacement current is provided after said pulse maximum.

16. Method according to claim 15, further comprising a step of synchronizing said relative decrease of said displacement current with plasma instabilities after said pulse maximum.

17. Method according to claim 9, wherein said at least one inductor comprises a choke coil operated in a saturated mode during said plasma pulse after said pulse maximum.

18. Method according to claim 1 wherein said energizing voltage is shaped such that said displacement current substantially comprises a triangular waveform.

19. Method according to claim 1, wherein said substrate surface is moved through said discharge space.

20. Method according to claim 19, wherein said energizing voltage is an alternating voltage operated at a frequency in a range of 1 kHz and 1 MHz.

21. Method according to claim 1, wherein at least one of said electrodes is covered by a dielectric material.

22. Apparatus for removing contaminants from a surface of a substrate by subjecting said substrate surface to an atmospheric pressure glow plasma, comprising a discharge space, wherein said discharge space comprises one or more electrodes, means for generating said atmospheric pressure glow plasma in said discharge space using said electrodes, wherein means for generating said plasma comprise means for applying an AC plasma energizing voltage to said electrodes for causing a plasma current and a displacement current, wherein said apparatus further comprises means for controlling said displacement current during plasma generation for stabilizing said plasma such that modification of properties of said substrate surface is prevented.

23. Apparatus according to claim 22, wherein said means for controlling said displacement current are arranged for providing a relative decrease of said displacement current during plasma generation.

24. Apparatus according to claim 22, wherein said means for controlling said displacement current comprises at least one of a group comprising an inductor, a matching coil arranged for being operated substantially in an unsaturated mode during plasma generation, a choke coil arranged for being operated in a saturated mode during plasma generation, and pulse generator means providing voltage pulses superimposed on said energizing voltage.

25. Apparatus according to claim 22, wherein at least one of said electrodes is covered by a dielectric material.

26. Apparatus according to claim 22, wherein said means for generating said plasma are arranged for generating at least one plasma pulse having a pulse maximum, and wherein said means for controlling said displacement current are arranged for controlling said displacement current after said pulse maximum.

27. Apparatus according to claim 26, wherein said controlling means comprises a choke coil arranged for being operated in a saturated mode during plasma generation, and wherein said choke coil is arranged for being in a saturated state during said plasma pulse after said pulse maximum.

28. Apparatus according to claim 22, wherein said means for generating said plasma are arranged for generating at least one plasma pulse having a pulse maximum, and wherein said means for controlling said displacement current are arranged for controlling said displacement current before said pulse maximum.

29. Apparatus according to claim 22, further comprising means for moving said substrate surface through said discharge space.

\* \* \* \* \*